United States Patent
Liao et al.

(10) Patent No.: US 10,658,208 B2
(45) Date of Patent: May 19, 2020

(54) POLYIMIDE COMPOSITION FOR PACKAGE STRUCTURE, PACKAGE STRUCTURE AND METHOD OF FABRICATING THE SAME

(71) Applicant: Taiwan Semiconductor Manufacturing Co., Ltd., Hsinchu (TW)

(72) Inventors: Sih-Hao Liao, New Taipei (TW); Hung-Jui Kuo, Hsinchu (TW); Yu-Hsiang Hu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 139 days.

(21) Appl. No.: 15/877,371

(22) Filed: Jan. 22, 2018

(65) Prior Publication Data

US 2019/0157121 A1  May 23, 2019

Related U.S. Application Data

(60) Provisional application No. 62/589,553, filed on Nov. 21, 2017.

(51) Int. Cl.
| | |
|---|---|
| *H01L 21/67* | (2006.01) |
| *C08L 79/08* | (2006.01) |
| *C08G 73/10* | (2006.01) |
| *C08K 5/5419* | (2006.01) |
| *G01R 33/46* | (2006.01) |
| *G01N 30/72* | (2006.01) |
| *C08K 5/5455* | (2006.01) |

(52) U.S. Cl.
CPC ...... *H01L 21/67121* (2013.01); *C08G 73/105* (2013.01); *C08G 73/106* (2013.01); *C08G 73/1042* (2013.01); *C08G 73/1082* (2013.01); *C08L 79/08* (2013.01); *C08K 5/5419* (2013.01); *C08K 5/5455* (2013.01); *G01N 30/72* (2013.01); *G01R 33/46* (2013.01)

(58) Field of Classification Search
CPC . H01L 21/67121; C08L 79/08; C08K 5/5419; C08K 5/5455; G01N 30/72; G01R 33/46
USPC ....................................................... 257/701
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |

*Primary Examiner* — Elias Ullah
(74) *Attorney, Agent, or Firm* — JCIPRNET

(57) ABSTRACT

A polyimide composition for a package structure is provided. The polyimide composition includes a polyimide precursor, a cross-linker, a photosensitizer, a first additive, a second additive and a solvent. The first additive comprises a polyether based compound, and the second additive comprises a siloxane based compound. The polyimide composition has more than 98% cyclization of the polyimide precursor when the polyimide composition is cured at a temperature range of 160° C. to 200° C.

20 Claims, 11 Drawing Sheets

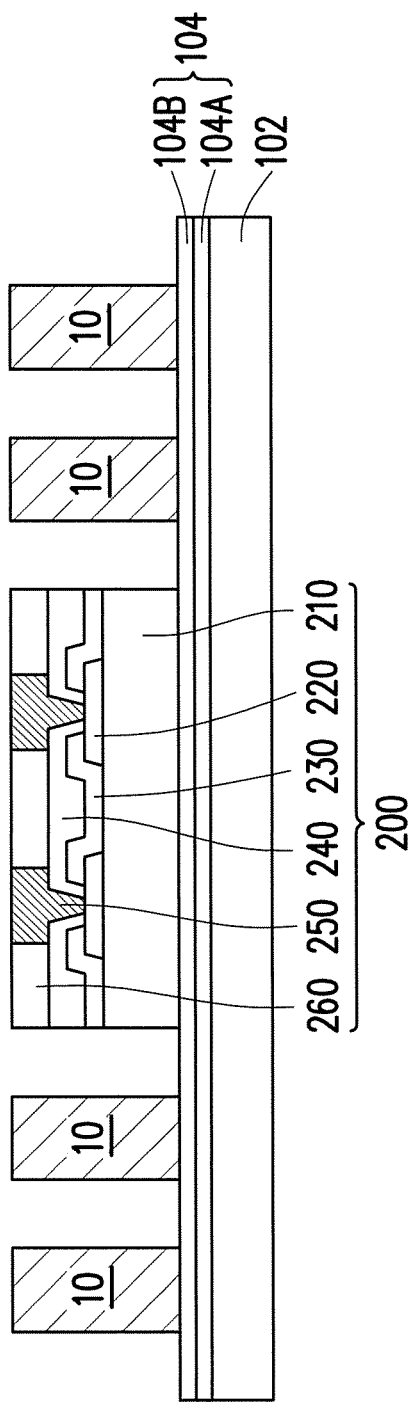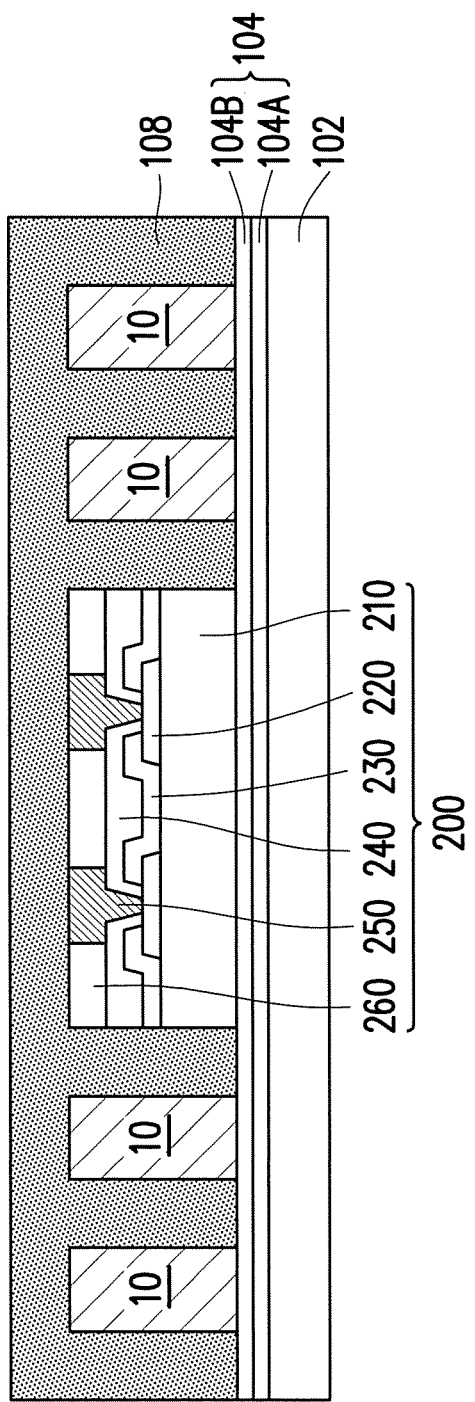

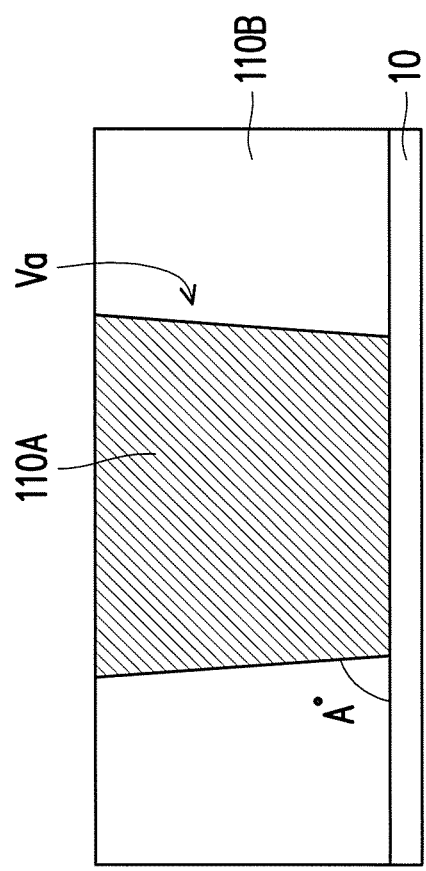

POLYIMIDE COMPOSITION FOR PACKAGE STRUCTURE, PACKAGE STRUCTURE AND METHOD OF FABRICATING THE SAME

CROSS-REFERENCE TO RELATED APPLICATION

This application claims the priority benefit of U.S. provisional application Ser. No. 62/589,553, filed on Nov. 21, 2017. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1F are schematic views illustrating various stages of a method of fabricating a semiconductor device according to some embodiments of the present disclosure.

DETAILED DESCRIPTION

Figure 1C:
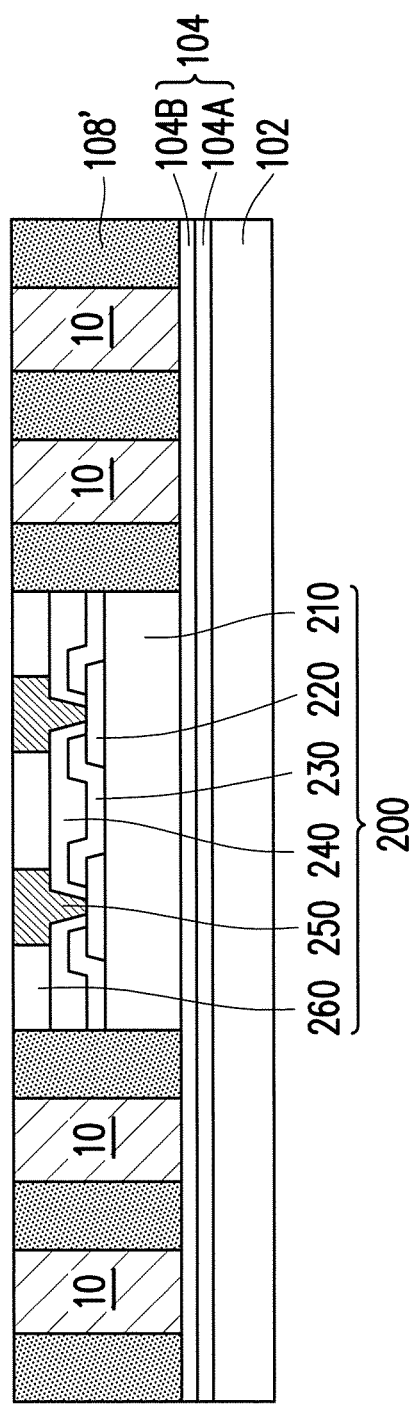

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1F are schematic views illustrating various stages of a method of fabricating a semiconductor device according to some embodiments of the present disclosure. Referring to FIG. 1A, a carrier 102 with a buffer layer 104 coated thereon is provided. The carrier 102 may be a glass carrier or any suitable carrier for carrying a semiconductor wafer or a reconstituted wafer used for the method of fabricating the package structure. In some embodiments, the buffer layer 104 includes, for example, a debonding layer 104A and a dielectric layer 104B. In certain embodiments, the debonding layer 104A is a light-to-heat conversion (LTHC) release layer. Furthermore, in some embodiments, the dielectric layer 104B may be made of dielectric materials such as benzocyclobutene ("BCB"), polybenzoxazole ("PBO"), or any other suitable polymer-based dielectric material. However, the materials of the carrier 102, the debonding layer 104A and the dielectric layer 104B are not limited to the descriptions of the embodiments. In some alternative embodiments, the dielectric layer 104B may be omitted; in other words, merely the debonding layer 104A is formed over the carrier 102.

In addition, in the exemplary embodiment, a plurality of through insulator vias 10 is formed on the buffer layer 104 and over the carrier 102, and at least one semiconductor die 200 is provided on the buffer layer 104. As shown in FIG. 1A, the through insulator vias 10 are through integrated fan-out ("InFO") vias. In some embodiments, the formation of the through insulator vias 10 includes forming a mask pattern (not shown) with openings, then forming a metallic material (not shown) filling up the openings by electroplating or deposition, and removing the mask pattern to form the through insulator vias 10 on the carrier 102. In some embodiments, the material of the through insulator vias 10 may include copper or copper alloys. In certain embodiments, the through insulator vias 10 are copper pillars.

In some embodiments, the semiconductor die 200 may be picked and placed on the buffer layer 104. In certain embodiments, the semiconductor die 200 is attached onto the carrier 102 or attached to the buffer layer 104 through a die attach film (not shown). In the exemplary embodiment, the semiconductor die 200, for example, includes a semiconductor substrate 210, a plurality of conductive pads 220, a passivation layer 230, a post passivation layer 240, a plurality of conductive vias 250, and a protection layer 260. In some embodiments, the passivation layer 230 is formed over the semiconductor substrate 210 and has openings that partially expose the conductive pads 220 on the semiconductor substrate 210. The semiconductor substrate 210 may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 220 may be aluminum pads, copper pads or other suitable metal pads. The passivation layer 230 may be a silicon oxide layer, a silicon nitride layer, a silicon oxy-nitride layer or a dielectric layer formed of any suitable dielectric materials. In the exemplary embodiment, the post-passivation layer 240 is optionally formed over the passivation layer 230. The post-passivation layer 240 covers the passivation layer 230 and has a plurality of contact openings. The conductive pads 220 are partially exposed by the contact openings of the post passivation layer 240. The post-passivation layer 240 may be a benzocyclobutene (BCB) layer, a polyimide layer, a polybenzoxazole (PBO) layer, or a dielectric layer formed by other suitable polymers. In some embodiments, the conductive posts or conductive vias 250 are formed on the conductive pads 220 by plating. In some embodiments, the protection layer 260 is formed on the post passivation layer 240 covering the conductive posts or conductive vias 250 so as to protect the conductive posts or conductive vias 250.

In some embodiments, the semiconductor die 200 placed on the buffer layer 104 may be arranged in an array, and when the semiconductor dies 200 are arranged in an array, the through insulator vias 10 may be classified into groups. The number of the semiconductor die 200 may correspond to the number of the groups of the through insulator vias 10. In the illustrated embodiment, the semiconductor die 200 may be picked and placed on the buffer layer 104 after the formation of the through insulator vias 10. However, the disclosure is not limited thereto. In some alternative embodiments, the semiconductor die 200 may be picked and placed on the buffer layer 104 before the formation of the through insulator vias 10.

Referring to FIG. 1B, an insulating material 108 is formed on the buffer layer 104 and over the semiconductor die 200. In some embodiments, the insulating material 108 is formed through, for example, a compression molding process, filling up the gaps between the semiconductor die 200 and the through insulator vias 10, and encapsulating the semiconductor die 200 and the through insulator vias 10. The conductive posts or conductive vias 250 and the protection layer 260 of the semiconductor die 200 are encapsulated by and well protected by the insulating material 108. In other words, the conductive posts or conductive vias 250 and the protection layer 260 of the semiconductor die 200 are not revealed and are well protected by the insulating material 108. In some embodiments, the insulating material 108 includes epoxy resins or other suitable resins.

Referring to FIG. 1C, the insulating material 108 is partially removed to expose the conductive posts 250 and the through insulator vias 10. In some embodiments, the insulating material 106 and the protection layer 260 are ground or polished by a mechanical grinding process and/or a chemical mechanical polishing (CMP) process until the top surfaces of the conductive posts 250 are revealed. In some embodiments, the through insulator vias 10 may be partially polished so that the top surfaces of the through insulator vias 10 are leveled with the top surfaces of the conductive posts 250. The insulating material 108 is polished to form an insulating encapsulant 108'. In some embodiments, the top surfaces of the insulating encapsulant 108', the through insulator vias 10, the conductive posts 250, and the polished protection layer 260 are coplanar and leveled with one another.

Figure 1D:
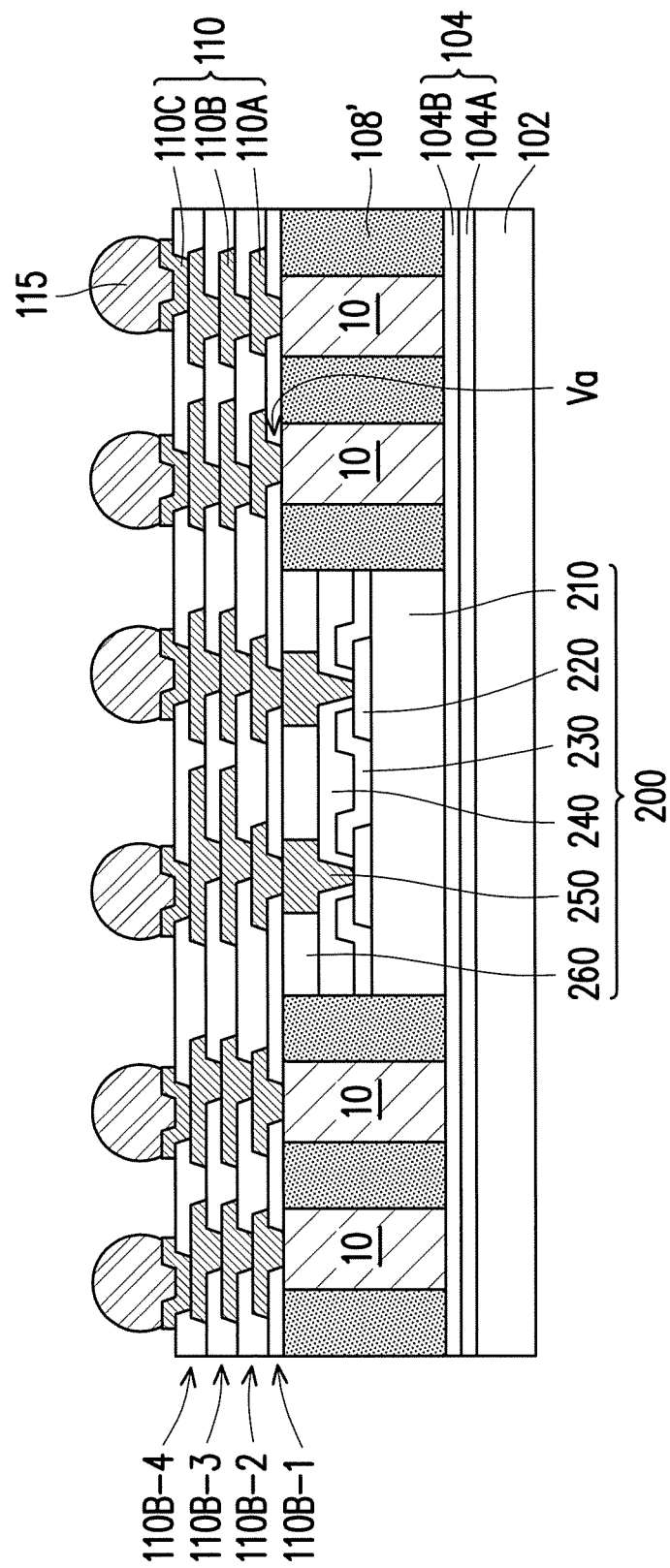

Referring to FIG. 1D, after the grinding process, a redistribution layer 110 is formed on the semiconductor die 200, on the through insulator vias 10, and on the insulating encapsulant 108'. In some embodiments, the redistribution layer 110 includes a plurality of conductive layers 110A and a plurality of dielectric layers 110B stacked alternately. In certain embodiments, at least one of the plurality of dielectric layers 110A is formed by providing a polyimide composition and curing the polyimide composition at a temperature range of 160° C. to 200° C. The polyimide composition includes, for example, a polyimide precursor, a cross-linker, a photosensitizer, a first additive, a second additive and a solvent, wherein the above components are mixed together and cured at a temperature range of 160° C. to 200° C. The polyimide composition has more than 98% cyclization of the polyimide precursor when the composition is cured at such temperature range. In certain embodiments, the polyimide composition has substantially 100% cyclization of the polyimide precursor when the polyimide composition is cured at 170° C.

In the exemplary embodiment, the polyimide precursor is, for example a poly(amic acid) ester, but not limited thereto. The poly(amic) acid ester may, for example, be formed by reacting a dianhydride and a diamine at ambient conditions in a dipolar aprotic solvent. For instance, pyromellitic dianhydride and 4,4'-oxydianiline (ODA) may be reacted to form the poly(amic) acid ester. Subsequently, the poly(amic) acid ester may be cyclized to form the final polyimide during the curing steps. It is noted that other types of dianhydrides and diamines may be used, as long as the polyimide precursor is prepared. Other polyimide precursors that are commercially available may also be used.

Furthermore, in the polyimide composition of the embodiment, the cross-linker is, for example tetraethylene glycol dimethacrylate or tetraethylene glycol diacrylate, but not limited thereto. In alternative embodiments, some other known cross-linking monomers may be used. In the polyimide composition of the embodiment, the photosensitizer (or initiator) is, for example, 2,2'-(phenylimino)diethanol, dibenzoylmethane, 4,4'-bis-ethylaminobenzophenone, or other known types of photopolymerization sensitizers may be used. The solvent in the polyimide composition is not particularly limited as long as the mixed components are appropriately dissolved. In some embodiments, the solvent is, for example, selected from 1-Methyl-2-pyrrolidone (NMP), ethyl lactate, γ-Butyrolactone, tetrahydrofuran (THF), dimethylformamide (DMF), or the like. In certain embodiments, the solvents mentioned above may be used alone or in multiple combinations.

In the exemplary embodiment, the first additive and the second additive are included in the polyimide composition, wherein the first additive comprises a polyether based compound, whereas the second additive comprises a siloxane based compound. In certain embodiments, the first additive is, for example, poly(ethylene glycol) or poly(propylene glycol). In some embodiments, the second additive is one compound selected from the group of compounds represented by Formula (1-1) to Formula (1-8):

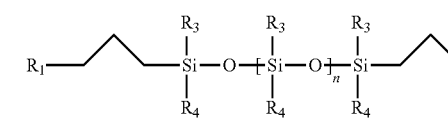

Formula (1-1)

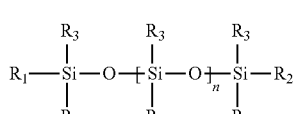

Formula (1-2)

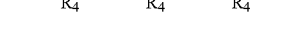

Formula (1-3)

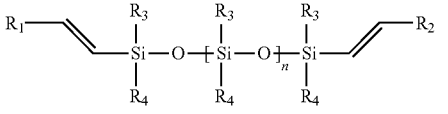

Formula (1-4)

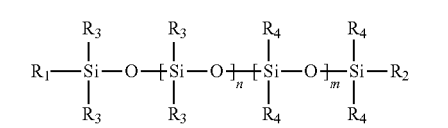

Formula (1-5)

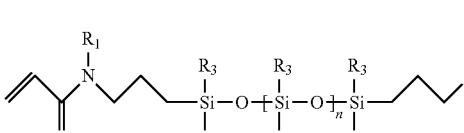

Formula (1-6)

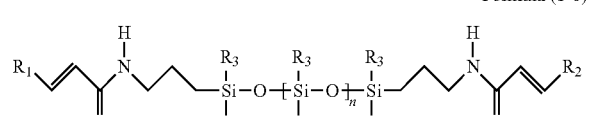

Formula (1-7)

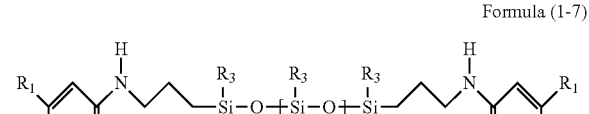

Formula (1-8)

wherein, in Formula (1-1) to Formula (1-8), $R_1$ and $R_2$ are independently selected from the group consisting of a hydrogen, a halogen, an alkyl group, a hydroxyl group, a thiol group, a vinyl group, a phenyl group, Si—$CH_3$, $SiX_3$, —$NH_2$, —$NX_2$, —NCOX, —$N(CH_3)_3$, —$N(X)_3$, —$SO_3H$, —COOH, —COOX, —$COCH_3$, $COCH_2CH_3$, —COX, —$CONCH_3$, —CONX, —$CH_2$—CH=$CH_2$, $CH_2$—CXC=$CX_2$,

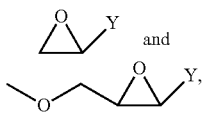

wherein $R_1$ and $R_2$ can be the same or different, $R_3$ and $R_4$ are independently selected from the group consisting of a hydrogen, a halogen, an alkyl group, a hydroxyl group, a vinyl group, a phenyl group, Si—$CH_3$, $SiX_3$, —COOH, —COOX, —$OCH_3$, —OX, $CONCH_3$, —CONX, —$COCH_2CH_3$, —COX, —$CH_2$—CH=$CH_2$, $CH_2$—CXC=$CX_2$,

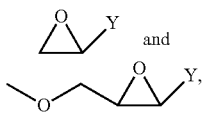

wherein $R_3$ and $R_4$ can be the same or different,

X is independently selected from the group consisting of an alkyl group,

Y is independently selected from the group consisting of a hydrogen, a halogen, an alkyl group, a hydroxyl group, a thiol group, a vinyl group, a phenyl group, Si—$CH_3$, $SiX_3$, —$NH_2$, —$NX_2$, —NCOX, —$N(CH_3)_3$, —$N(X)_3$, —$SO_3H$, —COOH, —COOX, —$COCH_3$, $COCH_2CH_3$, —COX, —$CONCH_3$, —CONX or —$CH_2$—CH=$CH_2$, $CH_2$—CXC=$CX_2$, and m and n independently represents an integer from 1 to 1000.

In Formula (1-1) to Formula (1-8) mentioned above, the alkyl group in $R_1$ to $R_4$ may for example be a methyl group, an ethyl group, a propyl group, a hexyl group or a tert-butyl group. The halogen in $R_1$ to $R_4$ may for example be any one of fluorine, bromine, chlorine or iodine. Furthermore, in certain embodiments, in Formula (1-1) to Formula (1-8), m and n independently represents an integer from 3 to 15.

In some embodiments, the compound of Formula (1-1) may further be represented by a compound of Formula (1-1a), wherein the definition for $R_1$ and $R_2$ are the same as mentioned above.

Formula (1-1a)

In some embodiments, the compound of Formula (1-2) may further be represented by a compound of Formula (1-2a), wherein the definition for $R_1$ and $R_2$ are the same as mentioned above.

Formula (1-2a)

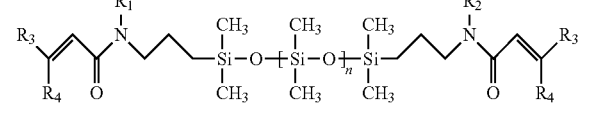

In some embodiments, the compound of Formula (1-5) may further be represented by a compound of Formula (1-5a), wherein the definition for $R_1$ and $R_2$ are the same as mentioned above.

Formula (1-5a)

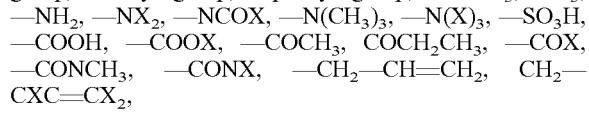

In some embodiments, the compound of Formula (1-6) may further be represented by a compound of Formula (1-6a), wherein the definition for $R_1$ and $R_2$ are the same as mentioned above.

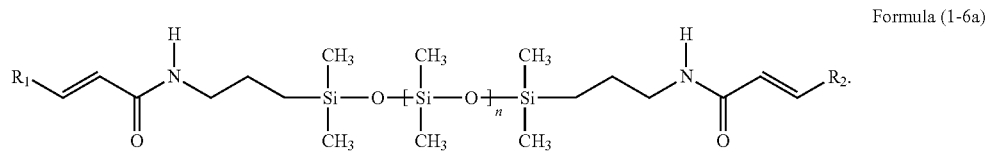

Formula (1-6a)

In some embodiments, the compound of Formula (1-7) may further be represented by a compound of Formula (1-7a), wherein the definition for $R_1$ and $R_2$ are the same as mentioned above.

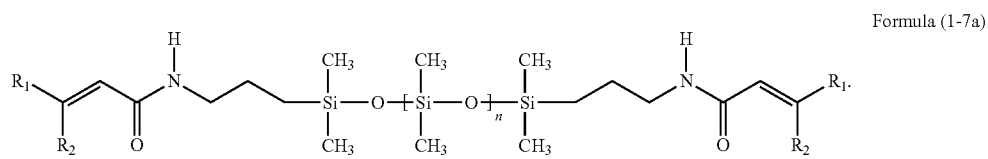

Formula (1-7a)

In the exemplary embodiment, the second additive is one compound selected from the group of compounds represented by Formula (2-1) to Formula (2-16), or poly(dimethylsiloxane)-graft-polyacrylate:

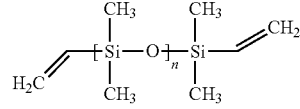

Formula (2-1)

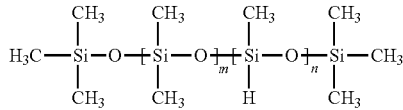

Formula (2-2)

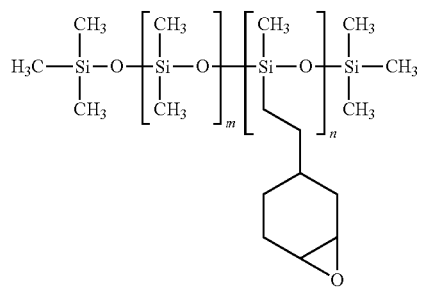

Formula (2-3)

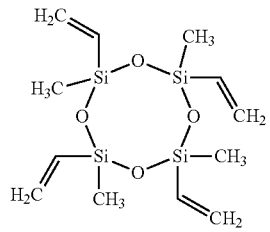

(Formula 2-4)

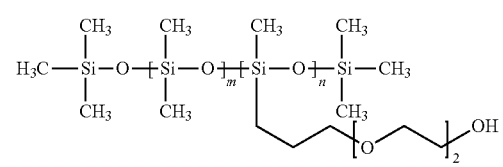

-continued

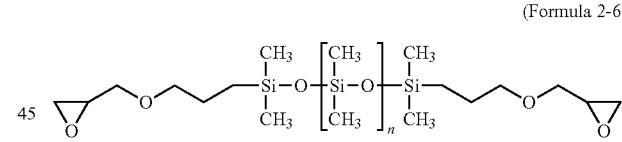

(Formula 2-5)

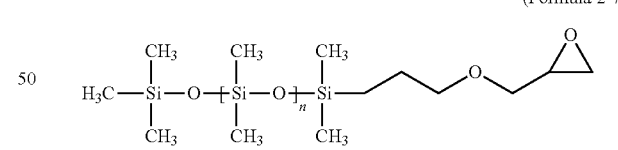

(Formula 2-6)

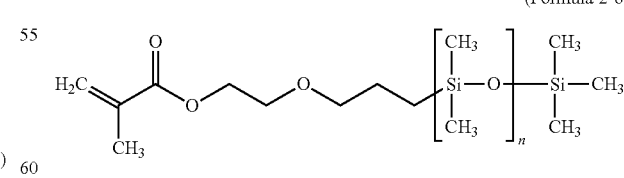

(Formula 2-7)

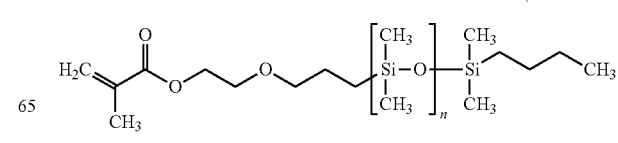

(Formula 2-8)

(Formula 2-9)

-continued

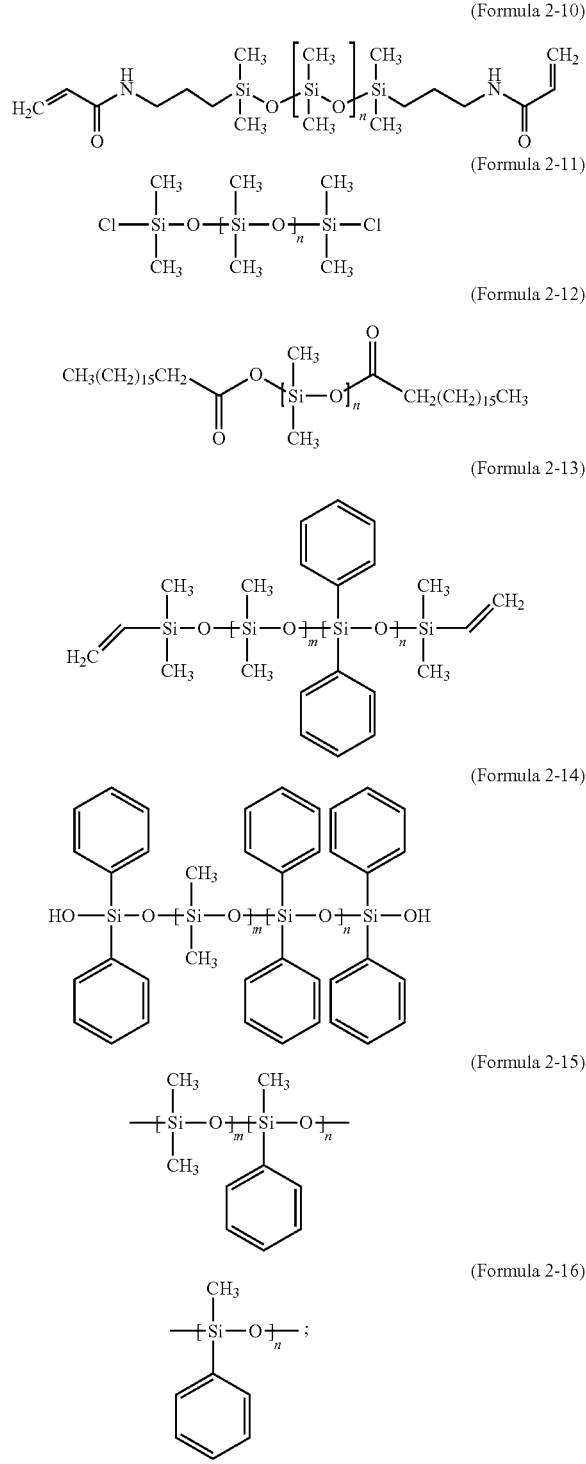

wherein, m and n represent an integer from 1 to 1000.

In certain embodiments, in Formula (2-1) to Formula (2-16) mentioned above, m and n independently represents an integer from 3 to 15.

In some embodiments, when the polyimide composition includes the polyimide precursor, the cross-linker, the photosensitizer, the solvent, the first additive and the second additive as mentioned above, then the dielectric layer 110B shown in FIG. 1D having the desirable properties can be achieved after curing. In certain embodiments, based on a total weight of the polyimide composition, an amount of the polyimide precursor is 25% to 35% by weight, an amount of the cross-linker is 5% to 15% by weight, an amount of the photosensitizer is 1% to 8% by weight, an amount of the first additive is 1% to 10% by weight, an amount of the second additive is 0.5% to 3% by weight, and the remaining contents being the solvent.

In some embodiments, in the case where the cross-linker is used in an amount of 5% to 15% by weight, then a coefficient of thermal expansion (CTE) of the dielectric layer 110B can be lowered. For example, in certain embodiments, the dielectric layer 110B formed by curing the polyimide composition has a coefficient of thermal expansion of 45 ppm to 55 ppm. In some embodiments, in the case where the first additive is used in an amount of 1% to 10% by weight, then the curing temperature of the composition may be lowered. In some embodiments, in the case where the second additive is used in an amount of 0.5% to 3% by weight, then the adhesion properties of the dielectric layer may be improved and a problem of delamination may be resolved. For example, in some embodiments, the dielectric layer formed by curing the polyimide composition has a peeling strength of 635 N/m to 675 N/m.

Referring back to FIG. 1D, in the illustrated embodiment, the dielectric layers 110B are formed with four layers, namely, the first dielectric layer 110B-1, the second dielectric layer 110B-2, the third dielectric layer 110B-3 and the fourth dielectric layer 110B-4, however, the present disclosure is not limited thereto. The number of dielectric layers 110B and conductive layers 110A may be adjusted based on product requirement. In the present embodiments, some of the dielectric layers 110B may be formed by using the polyimide composition mentioned above, while some other dielectric layers 110B may be formed without using the polyimide composition. In some embodiments, only the third dielectric layer 110B-3 and the fourth dielectric layer 110B-4 are formed with the polyimide composition as mentioned above. In some other embodiments, all of the first dielectric layer 110B-1, the second dielectric layer 110B-2, the third dielectric layer 110B-3 and the fourth dielectric layer 110B-4 are formed with the polyimide composition as mentioned above.

FIG. 1E is an enlarged view of the conductive layers 110A and dielectric layers 110B of FIG. 1D. As shown in FIG. 1D and FIG. 1E, each of the dielectric layers 110B are patterned to form a plurality of vias Va, which allows for the conductive layers 110A to be filled therein and to provide further connection. For example, referring to FIG. 1E, the conductive layer 110A is filled into the via Va of the dielectric layer 110B, which allows for the conductive layer 110A to be electrically connected to the through insulator vias 10. In some embodiments, when the polyimide composition mentioned above is used to form the dielectric layer 110B, then a via angle A° of the formed via Va of the dielectric layer 110B may be in the range of 85° to 95°. In some embodiments, the via angle A° may be approximately 88° to 90°. In certain embodiments, by using the polyimide composition to form the dielectric layer 110B, the lithography process for patterning the dielectric layer 110B can be more efficient, whereby the exposure energy and development time may be lowered.

Referring back to FIG. 1D, after forming the redistribution layer 110 with the stacked conductive layers 110A and dielectric layers 110B, a plurality of conductive balls 115 may be placed on the redistribution layer 110. In some embodiments, the topmost dielectric layer 110B (fourth dielectric layer 110B-4) of the redistribution layer 110 may include a plurality of conductive pads 110C. The conductive pads 110C are for example, under-ball metallurgy (UBM) patterns used for ball mount. In certain embodiments, the conductive balls 115 are placed on the conductive pads 110C through a ball placement process. In some embodiments, the conductive balls 115 are electrically connected to the semiconductor die 200 through the conductive pads 110C and the conductive layers 110A of the redistribution layer 110.

Figure 1F:
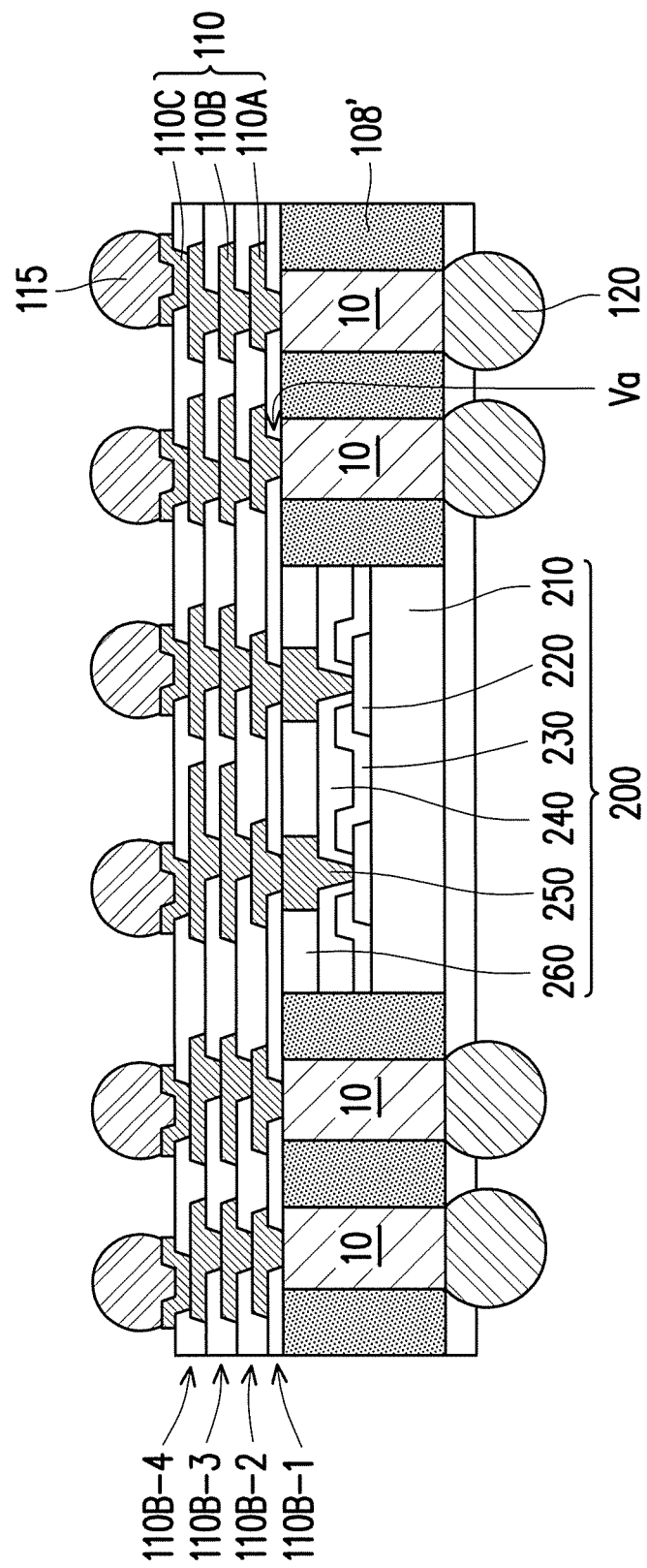

Referring to FIG. 1F, after the conductive balls 115 are mounted on the redistribution layer 110, the dielectric layer 104B is debonded from the debonding layer 104A, such that the dielectric layer 104B is separated from the debonding layer 104A and the carrier 102. In some embodiments, the debonding layer 104A (e.g., the LTHC release layer) may be irradiated by an UV laser such that the dielectric layer 104B is peeled from the carrier 102. As shown in FIG. 1F, the dielectric layer 104B may then be patterned to form a plurality of openings that expose the bottom surfaces of the through insulator vias. After the openings are formed in the dielectric layer 104B, a plurality of conductive balls 120 are placed on the bottom surfaces of the through insulator vias 10 to fill into the openings. In some embodiments, the conductive balls 120 are, for example, reflowed to bond with the bottom surfaces of the through insulator vias 10. As shown in FIG. 1F, after conductive balls 115 and conductive balls 120 are formed, a package structure having dual-side terminals is accomplished. In some other embodiments, another package may be electrically connected to the package structure having dual-side terminals through the conductive balls 120 such that a package-on-package (POP) structure is fabricated.

EXAMPLES

To prove that the dielectric layer 110B formed by using the polyimide composition of the disclosure will give superior properties, the following Examples are performed. The examples presented are purely illustrative and are not limited to the particular embodiments illustrated herein but include the permutations, which are obvious as set forth in the description. A polyimide composition having the first additive and second additive added thereto (Example 1) and a polyimide composition without the first additive and second additive (Comparative Example 1) were prepared according to details shown in Table 1.

Mass spectrometry and nuclear magnetic resonance (NMR) spectroscopy were performed to confirm the presence of the first additive and the second additive in the polyimide composition of Example 1.

Figure 2A:
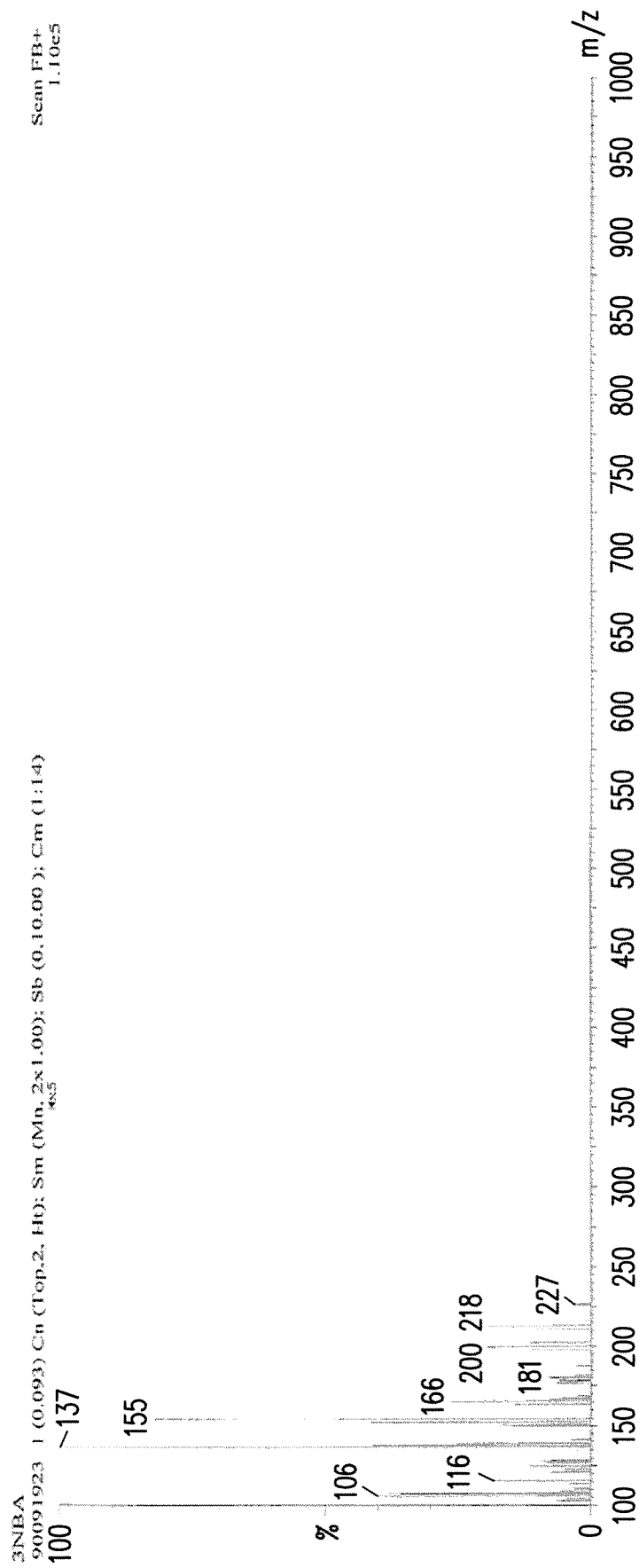
FIG. 2A shows the mass spectrum of a polyimide composition without additives according to some embodiments of the present disclosure.
Figure 2B:
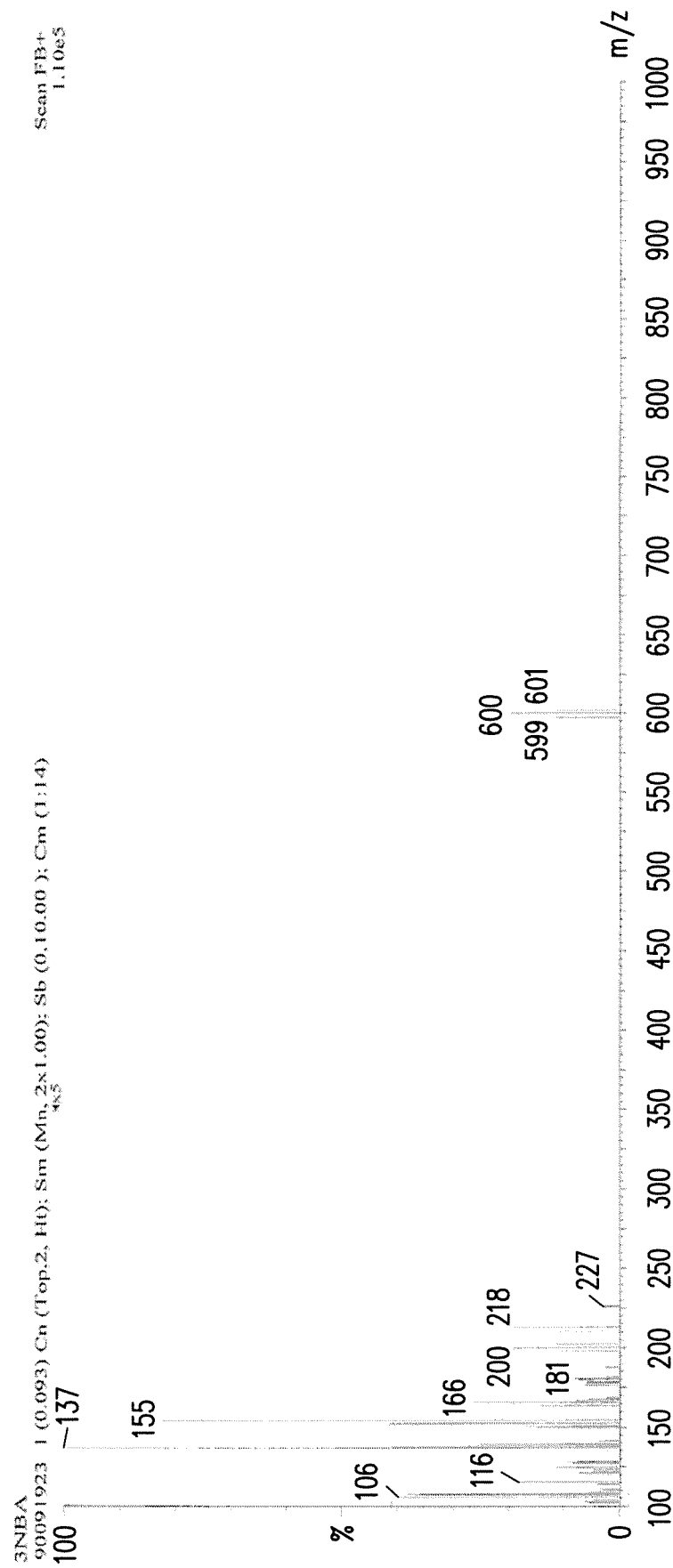
FIG. 2B shows the mass spectrum of a polyimide composition having a first additive according to some embodiments of the present disclosure.
Figure 2C:
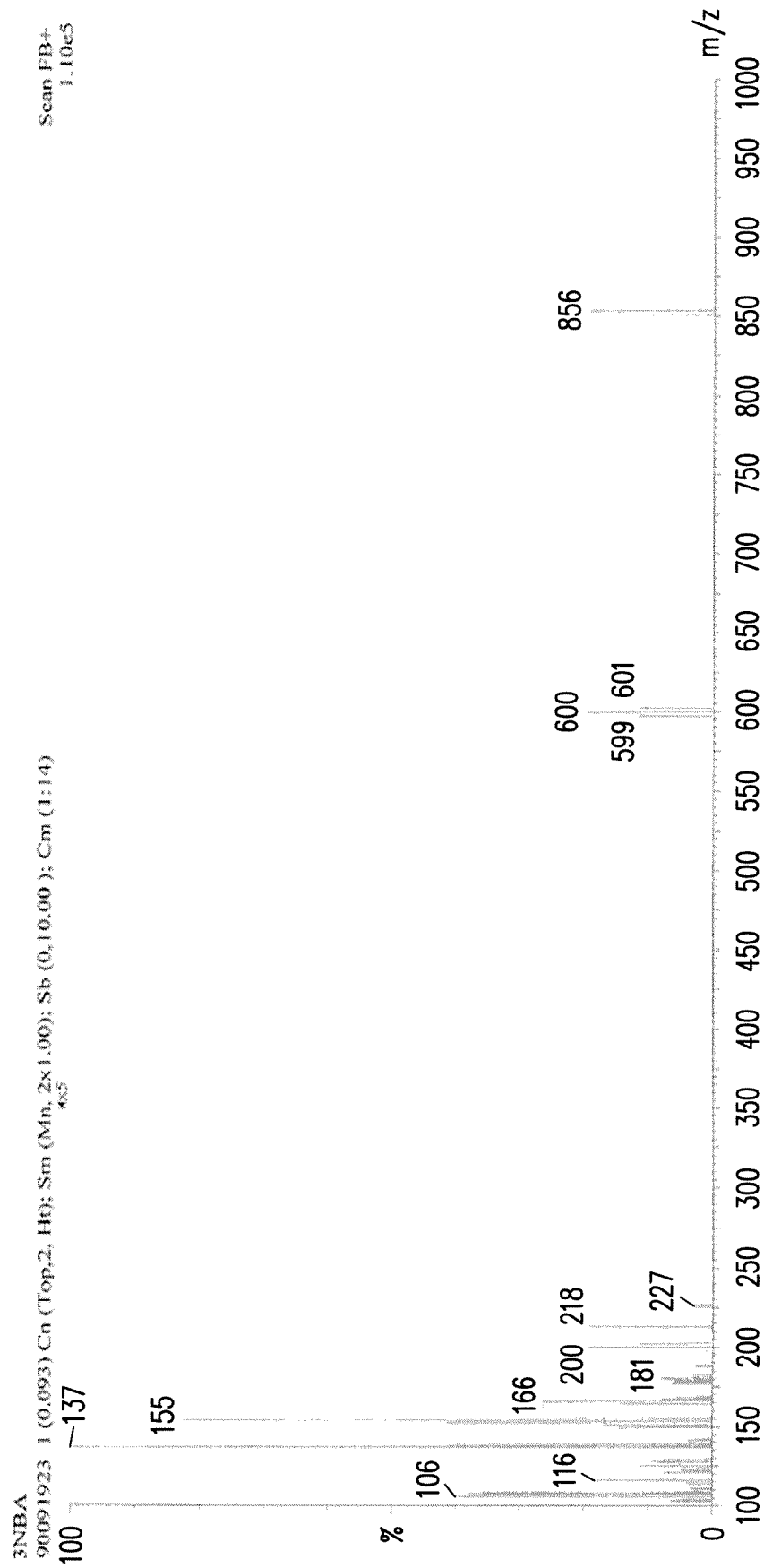
FIG. 2C shows the mass spectrum of a polyimide composition having a first additive and a second additive according to some embodiments of the present disclosure.

FIG. 2A shows the mass spectrum of a polyimide composition without additives according to some embodiments of the present disclosure. As shown in FIG. 2A, the peak at 218 m/z corresponds to the molecular weight of the pyromellitic dianhydride, while the peak at 200 m/z corresponds to the molecular weight of 4,4'-oxydianiline (ODA). The mass spectrum in FIG. 2A shows the presence of the polyimide precursor in the composition. FIG. 2B shows the mass spectrum of a polyimide composition having a first additive according to some embodiments of the present disclosure. As shown in FIG. 2B, when a first additive (poly(ethylene glycol)) is added into the composition, a peak at 600 m/z corresponding to the molecular weight of poly(ethylene glycol) can be observed. FIG. 2C shows the mass spectrum of a polyimide composition having a first additive and a second additive according to some embodiments of the present disclosure. As shown in FIG. 2C, when both the first additive (poly(ethylene glycol)) and the second additive (poly(dimethylsiloxane), bis(3-aminopropyl) terminated) are added into the composition, a peak at 856 m/z corresponding to the molecular weight of the poly(dimethylsiloxane) (bis(3-aminopropyl) terminated) and a peak at 600 m/z corresponding to the molecular weight of poly(ethylene glycol) can be observed. These results prove the presence of the first additive and the second additive in the polyimide composition of Example 1.

Figure 3A:
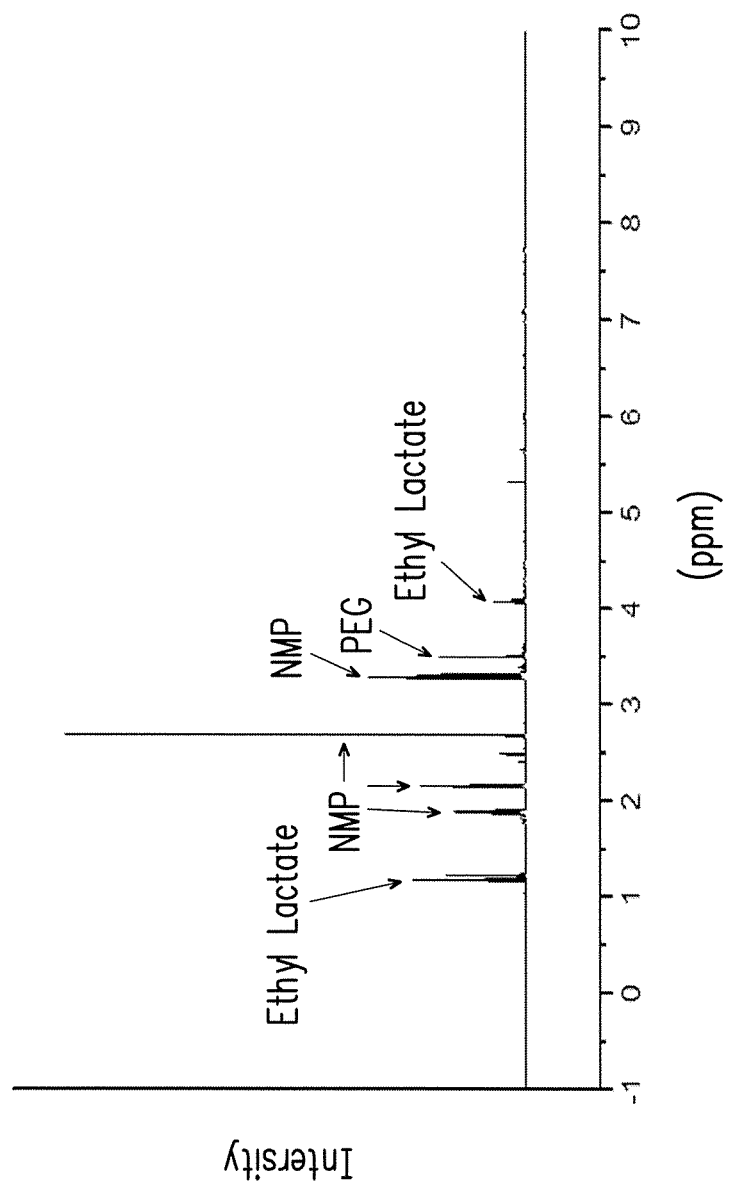
FIG. 3A shows the $^1$H-NMR spectrum of a polyimide composition having a first additive according to some embodiments of the present disclosure.
Figure 3B:
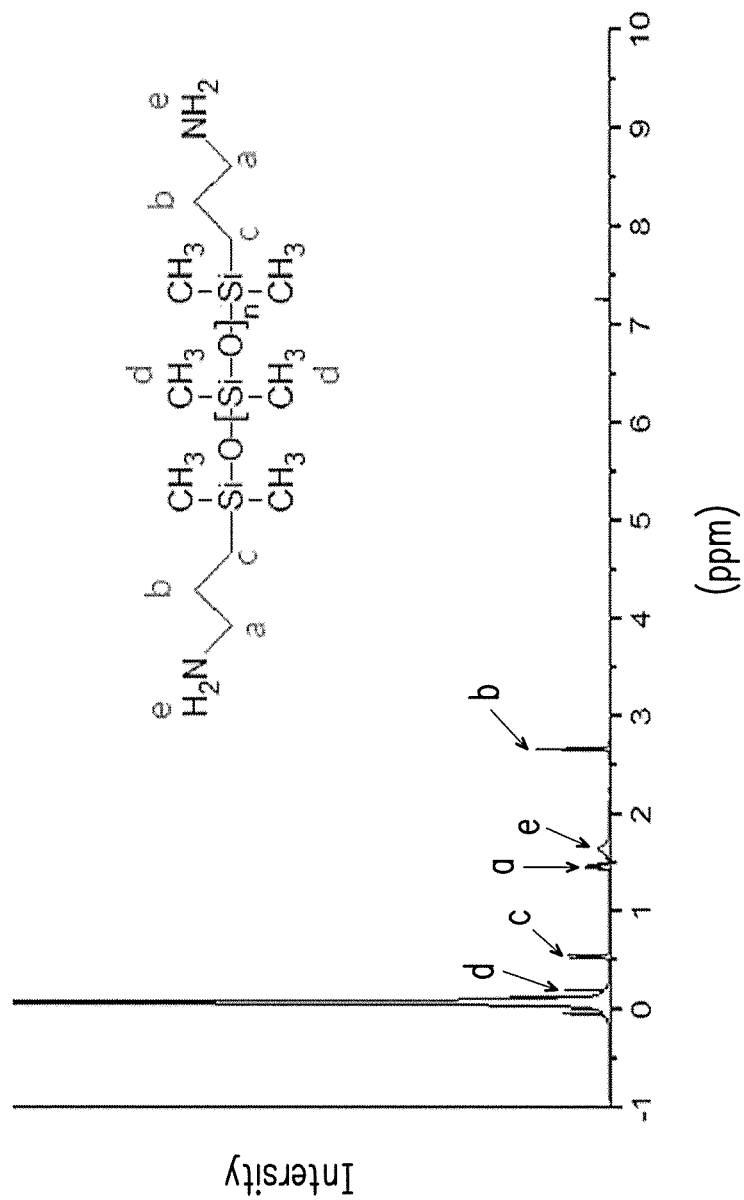
FIG. 3B shows the $^1$H-NMR spectrum of a second additive according to some embodiments of the present disclosure.

FIG. 3A shows the $^1$H-NMR spectrum of a polyimide composition having a first additive according to some embodiments of the present disclosure. As shown in FIG. 3A, the protons from ethyl lactate can be observed around 1.2~1.3 ppm and 4.1~4.2 ppm, the protons from NMP can be observed around 1.8~2.2 ppm and 3.3~3.4 ppm, whereas the protons from the first additive poly(ethylene glycol) can be observed around 3.5~3.6 ppm. FIG. 3B shows the $^1$H-NMR spectrum of a second additive according to some embodiments of the present disclosure. As shown in FIG. 3B, for the second additive poly(dimethylsiloxane) (bis(3-aminopropyl) terminated), the CH$_2$ protons at position "a" can be observed around 1.4~1.5 ppm, the CH$_2$ protons at position "b" can be observed around 2.6~2.7 ppm, the CH$_2$ protons at position "c" can be observed around 0.5~0.6 ppm,

TABLE 1

Figure 3C:
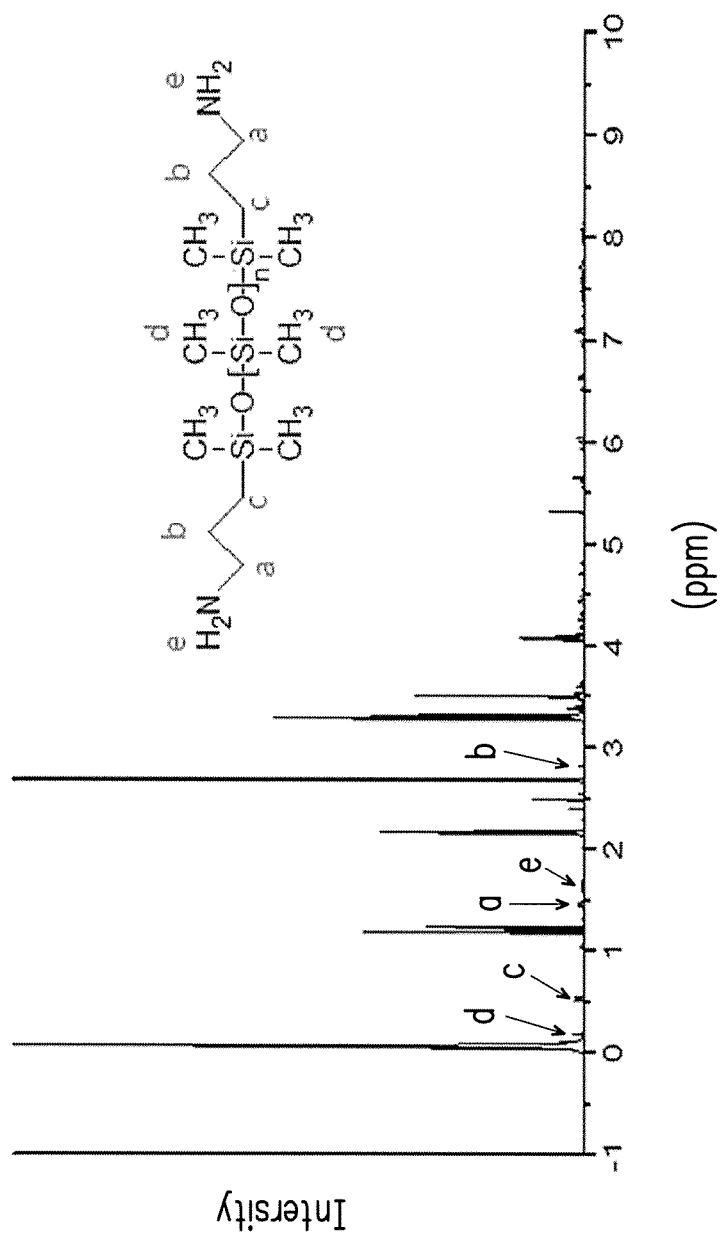
FIG. 3C shows the $^1$H-NMR spectrum of a polyimide composition having a first additive and a second additive according to some embodiments of the present disclosure.

| | Example 1 | | Comparative Example 1 | |
| --- | --- | --- | --- | --- |
| | Chemical Content | % by Weight | Chemical Content | % by Weight |
| Solvent | 1-Methyl-2-pyrrolidone (NMP) | 45-55 | 1-Methyl-2-pyrrolidone (NMP) | 45-55 |
| | Ethyl lactate | 10-15 | Ethyl lactate | 10-15 |
| Polyimide precursor | Polyamic acid ester | 25-35 | Polyamic acid ester | 25-35 |
| Cross-linker | Tetraethylene Glycol Dimethacrylate | 5-15 | Tetraethylene Glycol Dimethacrylate | 1-5 |
| Photosensitizer | 2,2'-(Phenylimino)diethanol | 1-8 | 2,2'-(Phenylimino)diethanol | 1-8 |
| First Additive | PEG (Mw: 600) | 1-10 | PEG (Mw: 600) | — |
| Second Additive | Poly(dimethylsiloxane), bis(3-aminopropyl) terminated (compound of Formula (1-1)) (Mw: 856) | 0.5-3 | Poly(dimethylsiloxane), bis(3-aminopropyl) terminated (compound of Formula (1-1)) (Mw: 856) | — | the methyl protons on the silicon at position "d" can be observed around 0.2~0.3 ppm, whereas the amine protons at position "e" can be observed around 1.6~1.7 ppm. These peaks can be used as a reference to confirm the presence of the second additive in the composition. FIG. 3C shows the $^1$H-NMR spectrum of a polyimide composition having a first additive and a second additive according to some embodiments of the present disclosure. As shown in FIG. 3C, when both the first additive and the second additive are added into the polyimide composition, their corresponding peaks as described in FIG. 3A and FIG. 3B can be observed. These results prove the presence of the first additive and the second additive in the polyimide composition of Example 1.

The film properties of the polyimide composition of Example 1 and the polyimide composition of Comparative Example 1 were evaluated, and the results are presented in Table 2 shown below.

TABLE 2

| | | Polyimide composition | |
|---|---|---|---|
| | Comparative Example 1 | Comparative Example 1 | Example 1 |
| Curing temperature | 230° C./1 hour | 170° C./1 hour | 170° C./1 hour |
| Cyclization (%) | 98% | 82% | 100% |
| Film Elongation | 86 | 65 | 83 |
| Properties Tensile strength | 195.9 | 170 | 185 |
| Young's Module | 3.0 | 3.5 | 3.4 |
| Coefficient of thermal expansion | 50 | 80 | 50 |
| Tg (TMA) | 200 | 170 | 205 |
| Peeling (N/m) strength MR5X | 650 | 200 | 675 |

From the results shown in Table 2, in the exemplary embodiment, it is noted that when curing the polyimide composition of Example 1 and Comparative Example 1 at the same temperature (170° C.), the polyimide composition of Example 1 clearly has better film properties with improved peeling strength and with 100% polyimide precursor cyclization. In comparison, at the curing temperature of 170° C., the polyimide composition of Comparative Example 1 showed lower peeling strength and with only 82% polyimide precursor cyclization. The polyimide composition of Comparative Example 1 only showed improved film properties when the curing temperature was increased to 230° C. These results prove that with the addition of the first and second additive, and with the increased usage of the cross-linker, the curing temperature of the polyimide composition can be significantly lowered, and a better peeling strength and polyimide precursor cyclization can be achieved at a lower temperature.

Moreover, during the lithography process for patterning the cured polyimide composition (dielectric layer) to form vias, it is found that the exposure energy can be reduced from 250 mJ (in Comparative Example 1) to 130 mJ (in Example 1), and the development time can be reduced from 40 seconds (in Comparative Example 1) to 18 seconds (in Example 1). The formed via angle also changed from 80° (in Comparative Example 1) to 88° (in Example 1). A delamination assessment of the formed dielectric layer when curing the different polyimide composition at the same temperature (170° C.) also revealed that the side-wall stress of the polyimide composition of Example 1 is 20% lower than that of the polyimide composition of Comparative Example 1. That is, when the polyimide composition of Example 1 is used to form the dielectric layer, then the sidewall adhesion may be improved, and the delamination issue may be resolved.

According to the above embodiments, the polyimide composition of the disclosure includes at least a cross-linker, a first additive and a second additive. In case where the cross-linker, the first additive and the second additive are used in the designated amounts, then the curing temperature of the polyimide composition can be significantly lowered, and better film properties can be achieved at a lower temperature. As high curing temperature usually induce time retention failure due to high thermal budget issues, the polyimide composition of the disclosure may be used to minimize the failure rate with the curing temperature set below 200° C. Furthermore, when the polyimide composition is used to form a dielectric layer of a package structure, due to a lower coefficient of thermal expansion, the sidewall adhesion may be improved, and the delamination issue may be resolved.

In some embodiments of the present disclosure, a polyimide composition for a package structure is provided. The polyimide composition comprises a polyimide precursor, a cross-linker, a photosensitizer, a first additive, a second additive and a solvent. The first additive comprises a polyether based compound, and the second additive comprises a siloxane based compound. The polyimide composition has more than 98% cyclization of the polyimide precursor when the polyimide composition is cured at a temperature range of 160° C. to 200° C.

In another embodiment of the present disclosure, a package structure comprising a semiconductor die, an insulating encapsulant, a redistribution layer is provided. The insulating encapsulant is encapsulating the semiconductor die. The redistribution layer is disposed on the semiconductor die and the insulating encapsulant, wherein the redistribution layer comprises a plurality of dielectric layers and a plurality of conductive layers stacked alternately. At least one of the plurality of dielectric layers is formed by curing a polyimide composition, wherein the polyimide composition comprises a polyimide precursor, a cross-linker, a photosensitizer, a first additive, a second additive and a solvent. The first additive comprises a polyether based compound, and the second additive comprises a siloxane based compound. The polyimide composition has more than 98% cyclization of the polyimide precursor when the polyimide composition is cured at a temperature range of 160° C. to 200° C.

In yet another embodiment of the present disclosure, a method of fabricating a package structure is provided. The method includes the following steps. At least one semiconductor die is bonded on a carrier. An insulating encapsulant is formed to encapsulate the at least one semiconductor die. A redistribution layer is formed on the insulating encapsulant and on the at least one semiconductor die. The redistribution layer is formed by forming a plurality of dielectric layers and a plurality of conductive layers stacked alternately. At least one of the plurality of dielectric layers is formed by providing a polyimide composition and curing the polyimide composition at a temperature range of 160° C. to 200° C. The polyimide composition comprises a polyimide precursor, a cross-linker, a photosensitizer, a first additive, a second additive and a solvent. The first additive comprises a polyether based compound, and the second additive comprises a siloxane based compound. The polyimide composition has more than 98% cyclization of the polyimide precursor when the polyimide composition is cured.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A polyimide composition for a package structure, comprising:
    a polyimide precursor;
    a cross-linker;
    a photosensitizer;
    a first additive, wherein the first additive comprises a polyether based compound;
    a second additive, wherein the second additive comprises a siloxane based compound; and
    a solvent;
    wherein the polyimide composition has more than 98% cyclization of the polyimide precursor when the polyimide composition is cured at a temperature range of 160° C. to 200° C.

2. The polyimide composition according to claim 1, wherein the polyimide composition has substantially 100% cyclization of the polyimide precursor when the polyimide composition is cured at 170° C.

3. The polyimide composition according to claim 1, wherein based on a total weight of the polyimide composition, an amount of the polyimide precursor is 25% to 35% by weight, an amount of the cross-linker is 5% to 15% by weight, an amount of the photosensitizer is 1% to 8% by weight, an amount of the first additive is 1% to 10% by weight, an amount of the second additive is 0.5% to 3% by weight, and the remaining contents being the solvent.

4. The polyimide composition according to claim 1, wherein the first additive is poly(ethylene glycol) or poly(propylene glycol).

5. The polyimide composition according to claim 1, wherein the second additive is one compound selected from the group of compounds represented by Formula (1-1) to Formula (1-8):

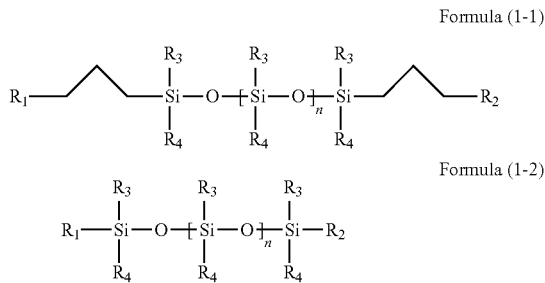

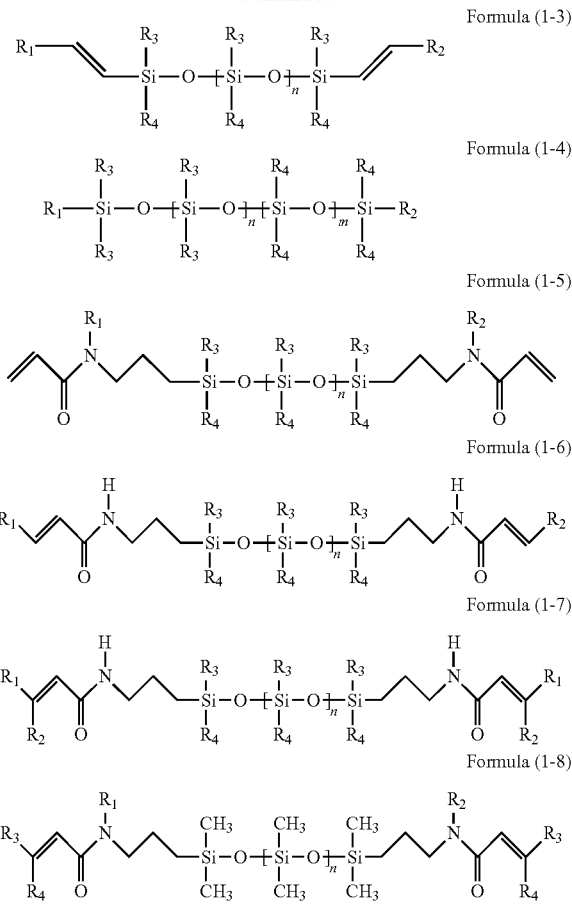

wherein, in Formula (1-1) to Formula (1-8), $R_1$ and $R_2$ are independently selected from the group consisting of a hydrogen, a halogen, an alkyl group, a hydroxyl group, a thiol group, a vinyl group, a phenyl group, Si—$CH_3$, $SiX_3$, —$NH_2$, —$NX_2$, —NCOX, —$N(CH_3)_3$, —$N(X)_3$, —$SO_3H$, —COOH, —COOX, —$COCH_3$, $COCH_2CH_3$, —COX, —$CONCH_3$, —CONX, —$CH_2$—CH=$CH_2$, $CH_2$—CXC=$CX_2$,

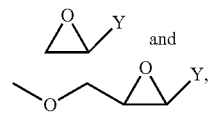 and wherein $R_1$ and $R_2$ can be the same or different, $R_3$ and $R_4$ are independently selected from the group consisting of a hydrogen, a halogen, an alkyl group, a hydroxyl group, a vinyl group, a phenyl group, Si—$CH_3$, $SiX_3$, —COOH, —COOX, —$OCH_3$, —OX, $CONCH_3$, —CONX, —$COCH_2CH_3$, —COX, —$CH_2$—CH=$CH_2$, $CH_2$—CXC=$CX_2$,

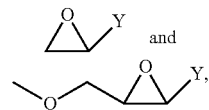 and wherein $R_3$ and $R_4$ can be the same or different,

X is independently selected from the group consisting of an alkyl group,

Y is independently selected from the group consisting of a hydrogen, a halogen, an alkyl group, a hydroxyl group, a thiol group, a vinyl group, a phenyl group, Si—CH$_3$, SiX$_3$, —NH$_2$, —NX$_2$, —NCOX, —N(CH$_3$)$_3$, —N(X)$_3$, —SO$_3$H, —COOH, —COOX, —COCH$_3$, COCH$_2$CH$_3$, —COX, —CONCH$_3$, —CONX or —CH$_2$—CH=CH$_2$, CH$_2$—CXC=CX$_2$, and m and n independently represent an integer from 1 to 1000.

6. The polyimide composition according to claim 1, wherein the second additive is one compound selected from the group of compounds represented by Formula (2-1) to Formula (2-16), or poly(dimethylsiloxane)-graft-polyacrylate:

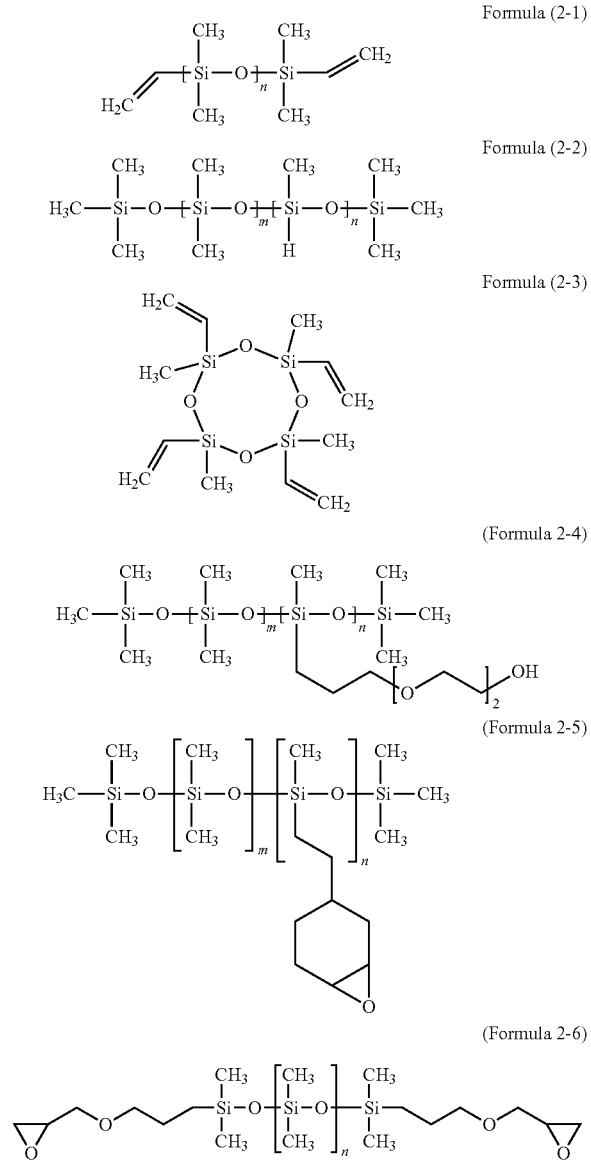

-continued

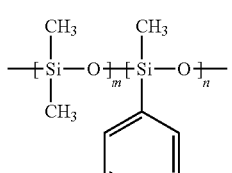
(Formula 2-15)

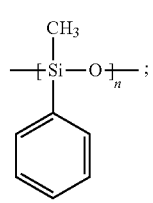
(Formula 2-16)

wherein, m and n independently represent an integer from 1 to 1000.

7. The polyimide composition according to claim 1, wherein the cross-linker is tetraethylene glycol dimethacrylate.

8. A package structure, comprising:
a semiconductor die;
an insulating encapsulant encapsulating the semiconductor die;
a redistribution layer disposed on the semiconductor die and the insulating encapsulant, wherein the redistribution layer comprises a plurality of dielectric layers and a plurality of conductive layers stacked alternately, and at least one of the plurality of dielectric layers is formed by curing a polyimide composition, wherein the polyimide composition comprises:
a polyimide precursor;
a cross-linker;
a photosensitizer;
a first additive, wherein the first additive comprises a polyether based compound;
a second additive, wherein the second additive comprises a siloxane based compound; and
a solvent;
wherein the polyimide composition has more than 98% cyclization of the polyimide precursor when the polyimide composition is cured at a temperature range of 160° C. to 200° C.

9. The package structure according to claim 8, wherein the polyimide composition has substantially 100% cyclization of the polyimide precursor when the polyimide composition is cured at 170° C.

10. The package structure according to claim 8, wherein based on a total weight of the polyimide composition, an amount of the polyimide precursor is 25% to 35% by weight, an amount of the cross-linker is 5% to 15% by weight, an amount of the photosensitizer is 1% to 8% by weight, an amount of the first additive is 1% to 10% by weight, an amount of the second additive is 0.5% to 3% by weight, and the remaining contents being the solvent.

11. The package structure according to claim 8, wherein the first additive is polyethylene glycol) or poly(propylene glycol).

12. The package structure according to claim 8, wherein the second additive is one compound selected from the group of compounds represented by Formula (1-1) to Formula (1-8):

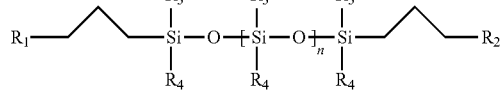
Formula (1-1)

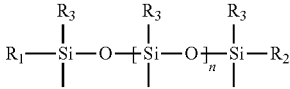
Formula (1-2)

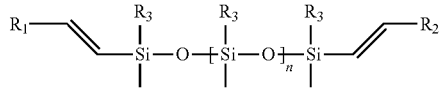
Formula (1-3)

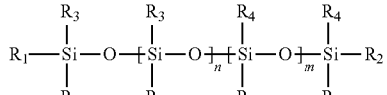
Formula (1-4)

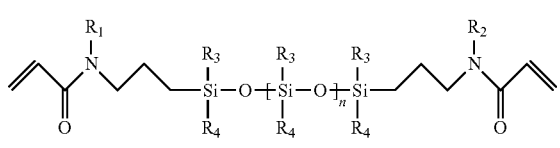
Formula (1-5)

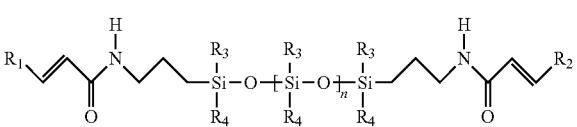
Formula (1-6)

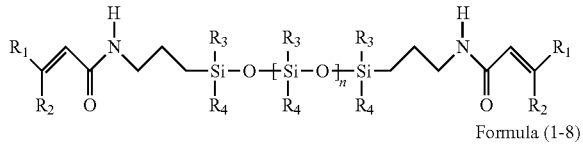
Formula (1-7)

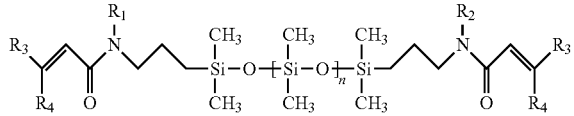
Formula (1-8)

wherein, in Formula (1-1) to Formula (1-8),
$R_1$ and $R_2$ are independently selected from the group consisting of a hydrogen, a halogen, an alkyl group, a hydroxyl group, a thiol group, a vinyl group, a phenyl group, Si—$CH_3$, $SiX_3$, —$NH_2$, —$NX_2$, —NCOX, —$N(CH_3)_3$, —$N(X)_3$, —$SO_3H$, —COOH, —COOX, —$COCH_3$, $COCH_2CH_3$, —COX, —$CONCH_3$, —CONX, —$CH_2$—CH=$CH_2$, $CH_2$—CXC=$CX_2$,

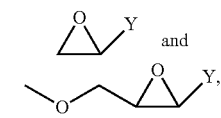
and wherein $R_1$ and $R_2$ can be the same or different,
$R_3$ and $R_4$ are independently selected from the group consisting of a hydrogen, a halogen, an alkyl group, a hydroxyl group, a vinyl group, a phenyl group, Si—

CH₃, SiX₃, —COOH, —COOX, —OCH₃, —OX, CONCH₃, —CONX, —COCH₂CH₃, —COX, —CH₂—CH=CH₂, CH₂—CXC=CX₂,

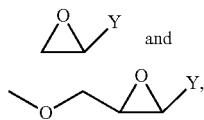

wherein R₃ and R₄ can be the same or different,

X is independently selected from the group consisting of an alkyl group,

Y is independently selected from the group consisting of a hydrogen, a halogen, an alkyl group, a hydroxyl group, a thiol group, a vinyl group, a phenyl group, Si—CH₃, SiX₃, —NH₂, —NX₂, —NCOX, —N(CH₃)₃, —N(X)₃, —SO₃H, —COOH, —COOX, —COCH₃, COCH₂CH₃, —COX, —CONCH₃, —CONX or —CH₂—CH=CH₂, CH₂—CXC=CX₂, and m and n independently represent an integer from 1 to 1000.

13. The package structure according to claim 8, wherein the second additive is one compound selected from the group of compounds represented by Formula (2-1) to Formula (2-16), or poly(dimethylsiloxane)-graft-polyacrylate:

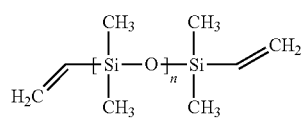
Formula (2-1)

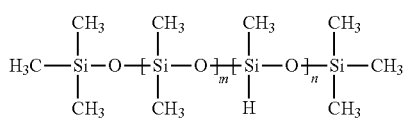
Formula (2-2)

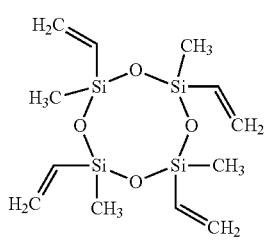
Formula (2-3)

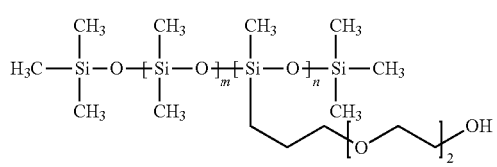
(Formula 2-4)

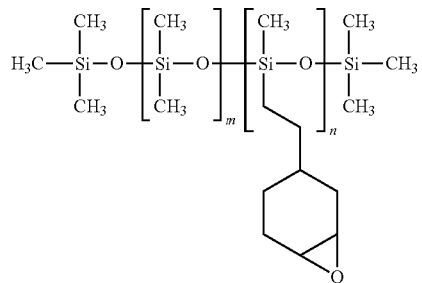
(Formula 2-5)

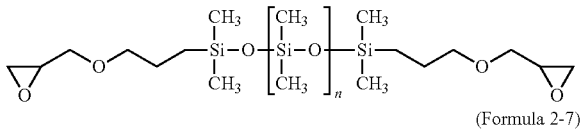
(Formula 2-6)

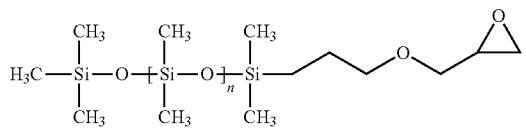
(Formula 2-7)

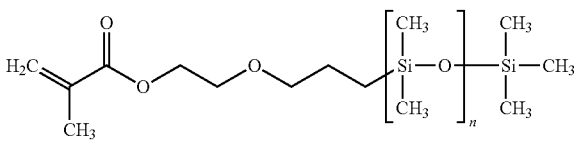
(Formula 2-8)

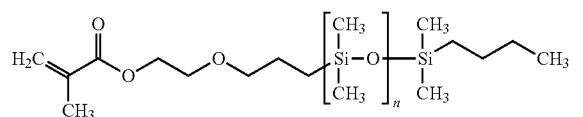
(Formula 2-9)

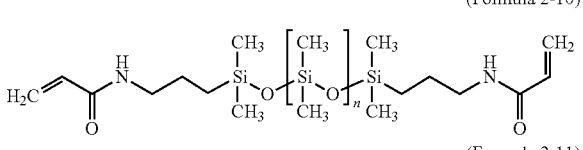
(Formula 2-10)

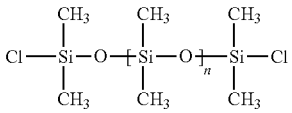
(Formula 2-11)

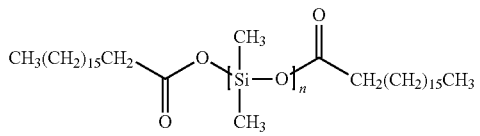
(Formula 2-12)

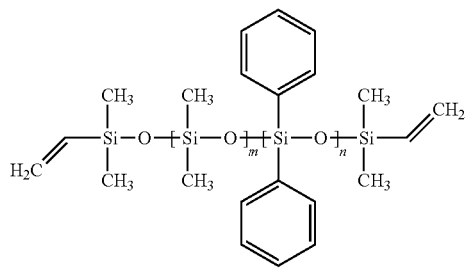
(Formula 2-13)

(Formula 2-14)

HO—Si—O—[Si—O]$_m$—[Si—O]$_n$—Si—OH (with phenyl groups and CH$_3$ groups)

(Formula 2-15)

—[Si(CH$_3$)$_2$—O]$_m$—[Si(phenyl)(CH$_3$)—O]$_n$—

(Formula 2-16)

—[Si(CH$_3$)(phenyl)—O]$_n$—;

wherein, m and n independently represent an integer from 1 to 1000.

14. The package structure according to claim 8, wherein the cross-linker is tetraethylene glycol dimethacrylate.

15. The package structure according to claim 8, wherein the dielectric layer formed by curing the polyimide composition has a coefficient of thermal expansion of 45 ppm to 55 ppm.

16. The package structure according to claim 8, wherein the dielectric layer formed by curing the polyimide composition has a peeling strength of 635 N/m to 675 N/m.

17. A method of fabricating a package structure, comprising:
bonding at least one semiconductor die on a carrier;
forming an insulating encapsulant encapsulating the at least one semiconductor die;
forming a redistribution layer on the insulating encapsulant and on the at least one semiconductor die, wherein the forming of the redistribution layer comprises:
forming a plurality of dielectric layers and a plurality of conductive layers stacked alternately, and at least one of the plurality of dielectric layers is formed by providing a polyimide composition and curing the polyimide composition at a temperature range of 160° C. to 200° C., wherein the polyimide composition comprises:
a polyimide precursor;
a cross-linker;
a photosensitizer;
a first additive, wherein the first additive comprises a polyether based compound;
a second additive, wherein the second additive comprises a siloxane based compound; and
a solvent;
wherein the polyimide composition has more than 98% cyclization of the polyimide precursor when the polyimide composition is cured.

18. The method of fabricating a package structure according to claim 17, wherein based on a total weight of the polyimide composition, an amount of the polyimide precursor is 25% to 35% by weight, an amount of the cross-linker is 5% to 15% by weight, an amount of the photosensitizer is 1% to 8% by weight, an amount of the first additive is 1% to 10% by weight, an amount of the second additive is 0.5% to 3% by weight, and the remaining contents being the solvent.

19. The method of fabricating a package structure according to claim 17, wherein the second additive is one compound selected from the group of compounds represented by Formula (1-1) to Formula (1-8):

Formula (1-1)

$R_1$—CH$_2$CH$_2$—Si($R_3$)($R_4$)—O—[Si($R_3$)($R_4$)—O]$_n$—Si($R_3$)($R_4$)—CH$_2$CH$_2$—$R_2$

Formula (1-2)

$R_1$—Si($R_3$)($R_4$)—O—[Si($R_3$)($R_4$)—O]$_n$—Si($R_3$)($R_4$)—$R_2$

Formula (1-3)

$R_1$—CH=CH—Si($R_3$)($R_4$)—O—[Si($R_3$)($R_4$)—O]$_n$—Si($R_3$)($R_4$)—CH=CH—$R_2$

Formula (1-4)

$R_1$—Si($R_3$)($R_3$)—O—[Si($R_3$)($R_4$)—O]$_n$—[Si($R_4$)($R_4$)—O]$_m$—Si($R_4$)($R_4$)—$R_2$

Formula (1-5)

$R_1$—C(=O)—N—CH$_2$CH$_2$CH$_2$—Si($R_3$)($R_4$)—O—[Si($R_3$)($R_4$)—O]$_n$—Si($R_3$)($R_4$)—CH$_2$CH$_2$CH$_2$—N—C(=O)—$R_2$

Formula (1-6)

$R_1$—CH=CH—C(=O)—NH—CH$_2$CH$_2$CH$_2$—Si($R_3$)($R_4$)—O—[Si($R_3$)($R_4$)—O]$_n$—Si($R_3$)($R_4$)—CH$_2$CH$_2$CH$_2$—NH—C(=O)—CH=CH—$R_2$

Formula (1-7)

$R_1$($R_2$)C=CH—C(=O)—NH—CH$_2$CH$_2$CH$_2$—Si($R_3$)($R_4$)—O—[Si($R_3$)($R_4$)—O]$_n$—Si($R_3$)($R_4$)—CH$_2$CH$_2$CH$_2$—NH—C(=O)—CH=C($R_1$)($R_2$)

Formula (1-8)

$R_3$($R_4$)C=CH—C(=O)—N($R_1$)—CH$_2$CH$_2$CH$_2$—Si(CH$_3$)$_2$—O—[Si(CH$_3$)$_2$—O]$_n$—Si(CH$_3$)$_2$—CH$_2$CH$_2$CH$_2$—N($R_2$)—C(=O)—CH=C($R_3$)($R_4$)

wherein, in Formula (1-1) to Formula (1-8),
$R_1$ and $R_2$ are independently selected from the group consisting of a hydrogen, a halogen, an alkyl group, a hydroxyl group, a thiol group, a vinyl group, a phenyl group, Si—CH$_3$, SiX$_3$, —NH$_2$, —NX$_2$, —NCOX, —N(CH$_3$)$_3$, —N(X)$_3$, —SO$_3$H, —COOH, —COOX,

—COCH₃, COCH₂CH₃, —COX, —CONCH₃, —CONX, —CH₂—CH=CH₂, CH₂—CXC=CX₂,

[epoxide structures with Y]

wherein R₁ and R₂ can be the same or different,

R₃ and R₄ are independently selected from the group consisting of a hydrogen, a halogen, an alkyl group, a hydroxyl group, a vinyl group, a phenyl group, Si—CH₃, SiX₃, —COOH, —COOX, —OCH₃, —OX, CONCH₃, —CONX, —COCH₂CH₃, —COX, —CH₂—CH=CH₂, CH₂—CXC=CX₂,

[epoxide structures with Y]

wherein R₃ and R₄ can be the same or different,

X is independently selected from the group consisting of an alkyl group,

Y is independently selected from the group consisting of a hydrogen, a halogen, an alkyl group, a hydroxyl group, a thiol group, a vinyl group, a phenyl group, Si—CH₃, SiX₃, —NH₂, —NX₂, —NCOX, —N-(CH₃)₃, —N(X)₃, —SO₃H, —COOH, —COOX, —COCH₃, COCH₂CH₃, —COX, —CONCH₃, —CONX or —CH₂—CH=CH₂, CH₂—CXC=CX₂, and m and n independently represent an integer from 1 to 1000.

20. The method of fabricating a package structure according to claim 17, wherein the second additive is one compound selected from the group of compounds represented by Formula (2-1) to Formula (2-16), or poly(dimethylsiloxane)-graft-polyacrylate:

[Formula (2-1) through Formula (2-12) chemical structures]

(Formula 2-13)
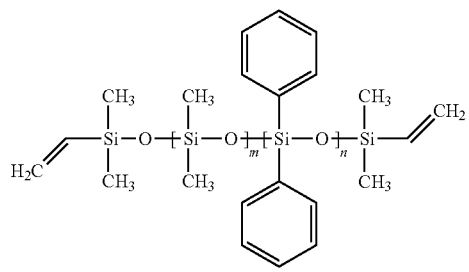
(Formula 2-14)
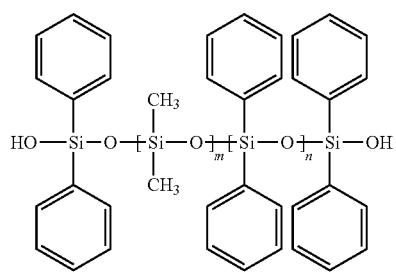
(Formula 2-15)
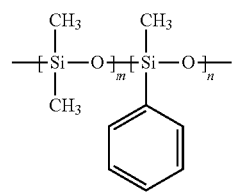
(Formula 2-16)
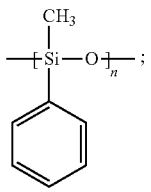
wherein, m and n independently represent an integer from 1 to 1000.
* * * * *